United States Patent
Terada et al.

(10) Patent No.: US 12,157,293 B2
(45) Date of Patent: Dec. 3, 2024

(54) SEPARATING METHOD, SEPARATING APPARATUS, AND SEPARATING SYSTEM

(71) Applicant: Tokyo Electron Limited, Tokyo (JP)

(72) Inventors: Takashi Terada, Koshi (JP); Yuji Mimura, Koshi (JP); Hiroshi Maeda, Koshi (JP); Kazutaka Noda, Koshi (JP); Masaru Honda, Koshi (JP); Ryoichi Sakamoto, Koshi (JP); Yutaka Yamasaki, Koshi (JP); Tatsuya Kitayama, Koshi (JP); Akira Fukutomi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/820,299

(22) Filed: Aug. 17, 2022

(65) Prior Publication Data

US 2023/0055853 A1 Feb. 23, 2023

(30) Foreign Application Priority Data

Aug. 18, 2021 (JP) .................................. 2021-133172

(51) Int. Cl.
*B32B 43/00* (2006.01)

(52) U.S. Cl.
CPC ........ *B32B 43/006* (2013.01); *B32B 2457/14* (2013.01); *Y10T 156/1126* (2015.01); *Y10T 156/1933* (2015.01)

(58) Field of Classification Search
CPC ............. B32B 43/006; Y10T 156/1126; Y10T 156/1833
See application file for complete search history.

(56) References Cited

U.S. PATENT DOCUMENTS

| | | | |
|---|---|---|---|
| 6,435,249 B1* | 8/2002 | Komine | A61K 31/4415 156/763 |
| 2012/0000613 A1* | 1/2012 | Thallner | B32B 43/006 156/752 |
| 2015/0075725 A1* | 3/2015 | Lindner | B32B 38/10 156/750 |
| 2018/0269077 A1* | 9/2018 | Zhang | H01L 21/6708 |
| 2021/0066110 A1* | 3/2021 | Suzuki | H01L 21/6836 |

FOREIGN PATENT DOCUMENTS

JP 2015-035562 A 2/2015

* cited by examiner

*Primary Examiner* — Philip C Tucker
*Assistant Examiner* — Nickolas R Harm
(74) *Attorney, Agent, or Firm* — Pearne & Gordon LLP

(57) ABSTRACT

A separating method includes holding a combined substrate and separating a first substrate. In the holding of the combined substrate, the combined substrate in which the first substrate and a second substrate are bonded is held. In the separating of the first substrate, the first substrate is separated from the combined substrate, starting from a side surface of the combined substrate. The separating of the first substrate includes brining a fluid containing water into contact with the side surface.

3 Claims, 8 Drawing Sheets

*FIG. 8A*  *FIG. 8B*  *FIG. 8C*
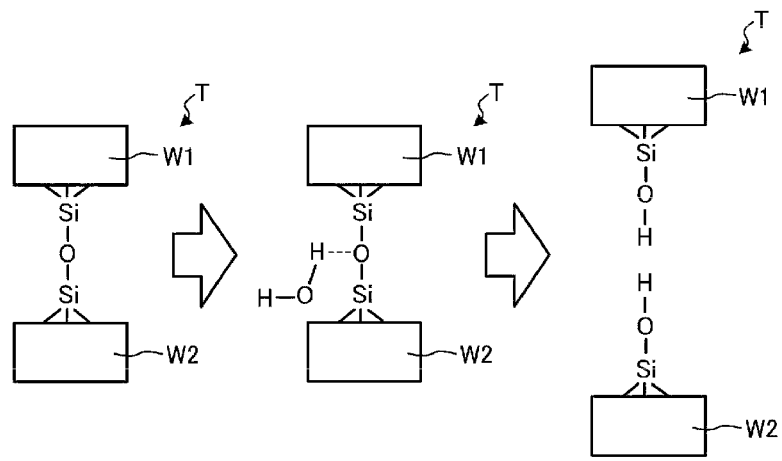
*FIG. 9*
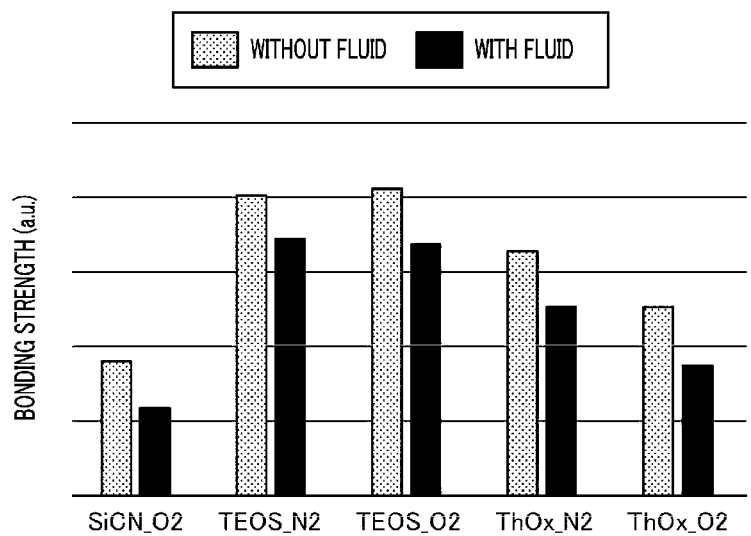

SEPARATING METHOD, SEPARATING APPARATUS, AND SEPARATING SYSTEM

CROSS-REFERENCE TO RELATED APPLICATION

This application claims the benefit of Japanese Patent Application No. 2021-133172 filed on Aug. 18, 2021, the entire disclosure of which is incorporated herein by reference.

TECHNICAL FIELD

The various aspects and embodiments described herein pertain generally to a separating method, a separating apparatus, and a separating system.

BACKGROUND

Recently, in a manufacturing process for a semiconductor device, for example, a semiconductor substrate such as a silicon wafer or a compound semiconductor wafer is getting thinner while having a larger diameter. Such a thin large-diameter semiconductor substrate may be bent or broken when it is transferred or polished. To suppress this problem, the transfer or the polishing of the semiconductor substrate is performed after reinforcing the semiconductor substrate by attaching a support substrate thereto, and, afterwards, a separating processing of separating the support substrate from the semiconductor substrate is performed (see, for example, Patent Document 1).

Patent Document 1: Japanese Patent Laid-open Publication No. 2015-035562

SUMMARY

In one exemplary embodiment, a separating method includes holding a combined substrate and separating a first substrate. In the holding of the combined substrate, the combined substrate in which the first substrate and a second substrate are bonded is held. In the separating of the first substrate, the first substrate is separated from the combined substrate, starting from a side surface of the combined substrate. The separating of the first substrate includes brining a fluid containing water into contact with the side surface.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 8A to FIG. 8C are diagrams for describing a change in a state of a bonding portion in the separating processing according to the exemplary embodiment;

FIG. 9 is a diagram showing a difference in bonding strength between a case where moisture is supplied to the combined substrate and a case where moisture is not supplied to the combined substrate in the separating processing;

DETAILED DESCRIPTION

Figure 1:
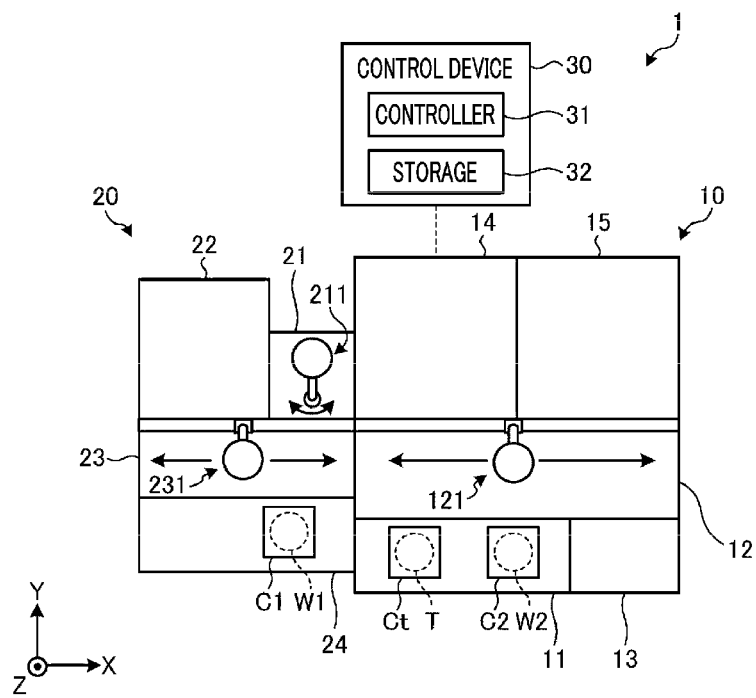
FIG. 1 is a schematic plan view illustrating a configuration of a separating system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a separating method, a separating apparatus, and a separating system according to the present disclosure will be described in detail with reference to the accompanying drawings. The present disclosure is not limited to the exemplary embodiments to be described below. Further, it should be noted that the drawings are schematic and relations in sizes of individual components and ratios of the individual components may sometimes be different from actual values. Even between the drawings, there may exist parts having different dimensional relationships or different ratios.

Recently, in a manufacturing process for a semiconductor device, for example, a semiconductor substrate such as a silicon wafer or a compound semiconductor wafer is getting thinner while having a larger diameter. Such a thin large-diameter semiconductor substrate may be bent or broken when it is transferred or polished. To suppress this problem, the transfer or the polishing of the semiconductor substrate is performed after reinforcing the semiconductor substrate by attaching a support substrate thereto, and, afterwards, a separating processing of separating the support substrate from the semiconductor substrate is performed.

Further, in recent years, in addition to a combined substrate in which substrates are bonded to each other with an adhesive, a combined substrate in which substrates are bonded to each other by a van der Waals force and a hydrogen bond (that is, an intermolecular force) has been widely used. Meanwhile, there is still a room for further improvement in a technique for efficiently performing a processing of separating one substrate from the combined substrate having such high bonding strength.

In this regard, there is a demand for a technique capable of overcoming the aforementioned problems, thus enabling to improve the efficiency of the separating processing.

<Configuration of Separating System>

Figure 2:
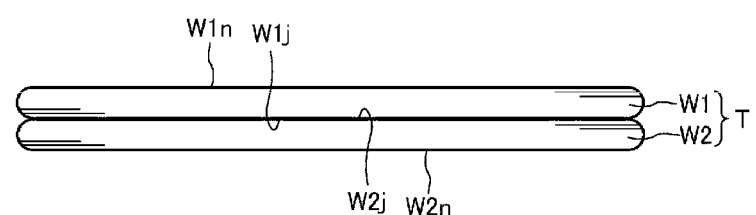
FIG. 2 is a schematic side view of a combined substrate according to the exemplary embodiment.

First, a configuration of a separating system 1 according to an exemplary embodiment will be explained with reference to FIG. 1 and FIG. 2. FIG. 1 is a schematic plan view illustrating the configuration of the separating system 1 according to the exemplary embodiment. FIG. 2 is a schematic side view of a combined substrate T according to the exemplary embodiment.

In the following, in order to clarify positional relationships, the X-axis, the Y-axis and the Z-axis which are orthogonal to each other will be defined. The positive Z-axis direction will be regarded as a vertically upward direction.

The separating system 1 shown in FIG. 1 is configured to separate a first substrate W1 shown in FIG. 2 from the combined substrate T in which the first substrate W1 and a second substrate W2 are bonded by an intermolecular force. In the following, the first substrate W1 will be referred to as "upper wafer W1," and the second wafer W2 will be referred to as "lower wafer W2." That is, the upper wafer W1 is an example of the first substrate, and the lower wafer W2 is an example of the second substrate.

In the following description, as shown in FIG. 2, among surfaces of the upper wafer W1, a surface to be bonded to the lower wafer W2 will be referred to as "bonding surface W1j", and a surface opposite to the bonding surface W1j will be referred to as "non-bonding surface W1n". Further, among surfaces of the lower wafer W2, a surface to be bonded to the upper wafer W1 will be referred to as "bonding surface W2j", and a surface opposite to the bonding surface W2j will be referred to as "non-bonding surface W2n."

The first substrate W1 is, for example, a semiconductor substrate, such as a silicon wafer or a compound semiconductor wafer, on which multiple electronic circuits are formed. Further, the second substrate W2 is, for example, a bare wafer on which no electronic circuit is formed. The first substrate W1 and the second substrate W2 have the substantially same diameter. Further, the second substrate W2 may have an electronic circuit formed thereon.

As shown in FIG. 1, the separating system 1 has two processing blocks: a first processing block 10 and a second processing block 20. The first processing block 10 and the second processing block 20 are disposed adjacent to each other.

In the first processing block 10, carrying-in of the combined substrate T, separating of the combined substrate T, and cleaning and carrying-out of the lower wafer W2 after being separated are performed. This first processing block 10 includes a carry-in/out station 11, a first transfer region 12, a standby station 13, a separation station 14, and a first cleaning station 15.

The carry-in/out station 11, the standby station 13, the separation station 14, and the first cleaning station 15 are disposed adjacent to the first transfer region 12. Specifically, the carry-in/out station 11 and the standby station 13 are arranged on the negative Y-axis side of the first transfer region 12, and the separation station 14 and the first cleaning station 15 are arranged on the positive Y-axis side of the first transfer region 12.

A plurality of cassette placing tables is provided in the carry-in/out station 11, and a cassette Ct for accommodating therein the combined substrate T and a cassette C2 for accommodating therein the lower wafer W2 after being separated are placed on each of the cassette placing table.

A first transfer device 121 configured to transfer the combined substrate T or the lower wafer W2 after being separated is disposed in the first transfer region 12. The first transfer device 121 is equipped with a transfer arm configured to be movable in a horizontal direction, movable up and down in a vertical direction, and pivotable about a vertical direction; and a substrate holder mounted to a leading end of this transfer arm.

In the first transfer region 12, a processing of transferring the combined substrate T to the standby station 13 and the separation station 14 and a processing of transferring the lower wafer W2 after being separated to the first cleaning station 15 and the carry-in/out station 11 are performed by the first transfer device 121.

In the standby station 13, a standby processing of allowing the combined substrate T to temporarily stand by before being subjected to a processing is performed when necessary. A placing table for placing thereon the combined substrate T transferred by the first transfer device 121 is disposed in this standby station 13.

In the separation station 14, a separating apparatus 5 (see FIG. 3) is disposed, and a separating processing of separating the upper wafer W1 from the combined substrate T is performed by the separating apparatus 5. A specific configuration and operation of the separating apparatus 5 will be described later.

In the first cleaning station 15, a cleaning processing for the lower wafer W2 after being separated is performed. In the first cleaning station 15, a first cleaning apparatus configured to clean the lower wafer W2 after being separated is disposed. As this first cleaning apparatus, one described in, for example, Japanese-Patent Laid-open Publication No. 2013-033925 may be used.

In the second processing block 20, cleaning and carrying-out of the separated upper wafer W1 are performed. This second processing block 20 is equipped with a delivery station 21, a second cleaning station 22, a second transfer region 23, and a carry-out station 24. The second cleaning station 22 is an example of a cleaning apparatus.

The delivery station 21, the second cleaning station 22, and the carry-out station 24 are arranged adjacent to the second transfer region 23. Specifically, the delivery station 21 and the second cleaning station 22 are arranged on the positive Y-axis side of the second transfer region 23, and the carry-out station 24 is disposed on the negative Y-axis side of the second transfer region 23.

The delivery station 21 is disposed adjacent the separation station 14 of the first processing block 10. In this delivery station 21, a delivery processing of receiving the separated upper wafer W1 from the separation station 14 and handing it over to the second cleaning station 22 is performed.

Disposed in the delivery station 21 is a second transfer device 211. The second transfer device 211 has a non-contact holder such as, but not limited to, a Bernoulli chuck. The separated upper wafer W1 is transferred in a non-contact manner by this second transfer device 211.

In the second cleaning station 22, a second cleaning processing of cleaning the separated upper wafer W1 is performed. A second cleaning apparatus configured to clean the separated upper wafer W1 is disposed in the second cleaning station 22. As the second cleaning apparatus, one described in, for example, Japanese Patent Laid-open Publication No. 2013-033925 may be used.

A third transfer device 231 configured to transfer the separated upper wafer W1 is disposed in the second transfer region 23. The third transfer device 231 is equipped with a transfer arm configured to be movable in a horizontal direction, movable up and down in a vertical direction, and pivotable about a vertical axis; and a substrate holder mounted to a leading end of this transfer arm. In the second transfer region 23, a processing of transferring the separated upper wafer W1 to the carry-out station 24 is performed by the third transfer device 231.

A plurality of cassette placing tables is provided in the carry-out station 24, and a cassette C1 for accommodating therein the separated upper wafer W1 is placed on each of the cassette placing tables.

Further, the separating system 1 is equipped with a control device 30. The control device 30 controls an operation of the separating system 1. Such a control device 30 is, for example, a computer, and includes a controller 31 and a storage 32. The storage 32 stores therein a program for controlling various processings such as a bonding processing. The controller 31 controls the operation of the separating system 1 by reading and executing the program stored in the storage 32.

This program may be recorded on a computer-readable recording medium and installed from this recording medium to the storage 32 of the control device 30. The computer-readable recording medium may be, by way of non-limiting example, a hard disk (HD), a flexible disk (FD), a compact disk (CD), a magnet optical disk (MO), or a memory card.

In the separating system 1 configured as described above, the first transfer device 121 of the first processing block 10 first takes out the combined substrate T from the cassette Ct disposed in the carry-in/out station 11, and carries the taken combined substrate T into the standby station 13.

For example, when the combined substrate T needs to stand by before being subjected to a processing due to a difference in processing time between the apparatuses, the combined substrate T may be temporarily placed on standby by using a temporary standby unit provided in the standby station 13. Thus, a loss time between a series of processes can be shortened.

Next, the combined substrate T is taken out from the standby station 13 by the first transfer device 121 and carried into the separation station 14. Then, the separating apparatus 5 disposed in the separation station 14 performs the separating processing on the combined substrate T. By this separating processing, the combined substrate T is separated into the upper wafer W1 and the lower wafer W2.

The lower wafer W2 after being separated is taken out from the separation station 14 by the first transfer device 121 and carried into the first cleaning station 15. In the first cleaning station 15, the first cleaning apparatus performs a first cleaning processing on the lower wafer W2 after being separated. By this first cleaning processing, the bonding surface W2$j$ of the lower wafer W2 is cleaned.

The lower wafer W2 after being subjected to the first cleaning processing is taken out from the first cleaning station 15 by the first transfer device 121, and is accommodated in the cassette C2 disposed in the carry-in/out station 11. Thereafter, the cassette C2 is taken out from the carry-in/out station 11 and collected. In this way, the processing upon the lower wafer W2 is ended.

Meanwhile, in the second processing block 20, a processing upon the upper wafer W1 after being separated is performed in parallel with the above-described processing in the first processing block 10.

In the second processing block 20, the second transfer device 211 disposed in the delivery station 21 first takes out the separated upper wafer W1 from the separation station 14, and carries it into the second cleaning station 22.

Here, a top surface, that is, the non-bonding surface Win of the separated upper wafer W1 is held by the separating apparatus 5, and the second transfer device 211 holds the bonding surface W1$j$ side of the upper wafer W1 from below in a non-contact manner. Thereafter, the second transfer device 211 turns the held upper wafer W1 upside down, and then places it in the second cleaning apparatus of the second cleaning station 22.

Accordingly, the upper wafer W1 is placed in the second cleaning apparatus with the bonding surface W1$j$ thereof facing upwards. Then, the second cleaning apparatus performs a second cleaning processing of cleaning the bonding surface W1$j$ of the upper wafer W1. By this second cleaning processing, the bonding surface W1$j$ of the upper wafer W1 is cleaned.

The upper wafer W1 after being subjected to the second cleaning processing is taken out from the second cleaning station 22 by the third transfer device 231 disposed in the second transfer region 23, and accommodated in the cassette C1 disposed in the carry-out station 24. Thereafter, the cassette C1 is taken out from the carry-out station 24 and collected. In this way, the processing upon the upper wafer W1 is ended.

As described above, the separating system 1 according to the exemplary embodiment includes a front end for the combined substrate T and the lower wafer W2 after being separated, and a front end for the upper wafer W1 after being separated.

Here, the front end for the combined substrate T and the lower wafer W2 after being separated includes the carry-in/out station 11 and the first transfer device 121, and the front end for the upper wafer W1 after being separated includes the carry-out station 24 and the third transfer device 231.

With this configuration, the processing of transferring the upper wafer W1 to the carry-in/out station 11 and the processing of transferring the lower wafer W2 to the carry-out station 24 can be performed in parallel. Therefore, a series of substrate processings can be performed efficiently.

Furthermore, in the separating system 1 according to the exemplary embodiment, the separation station 14 and the second cleaning station 22 are connected with the delivery station 21 therebetween. Accordingly, it becomes possible to carry the upper wafer W1 after being separated directly from the separation station 14 into the second cleaning station 22 without passing through the first transfer region 12 or the second transfer region 23. Therefore, the transfer of the upper wafer W1 after being separated can be performed smoothly.

<Configuration of Separating Apparatus>

Figure 3:
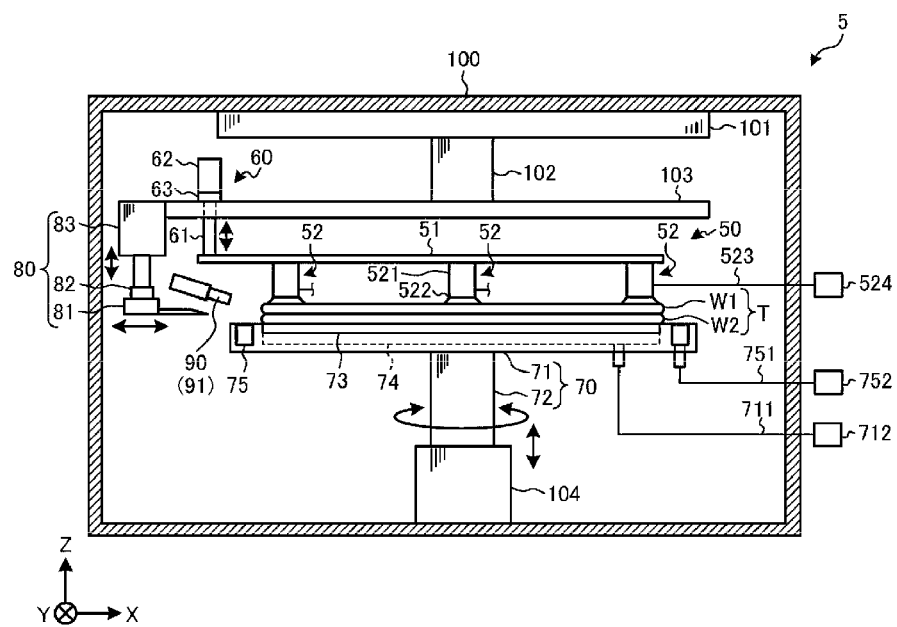
FIG. 3 is a schematic side view illustrating a configuration of a separating apparatus according to the exemplary embodiment.

Now, a configuration of the separating apparatus 5 provided in the separation station 14 will be elaborated with reference to FIG. 3. FIG. 3 is a schematic side view illustrating the configuration of the separating apparatus 5 according to the exemplary embodiment.

As depicted in FIG. 3, the separating apparatus 5 is equipped with a processing chamber 100. Carry-in/out openings (not shown) are provided in side surfaces of the processing chamber 100. The carry-in/out openings are respectively provided on the side of the first transfer region 12 (see FIG. 1) and on the side of the delivery station 21 (see FIG. 1).

The separating apparatus 5 includes a first holder 50, a moving unit 60, a second holder 70, a separation inducing unit 80, and a fluid supply 90, which are disposed inside the processing chamber 100.

The separating apparatus 5 attracts and holds the upper wafer W1 side of the combined substrate T from above with the first holder 50, and attracts and holds the lower wafer W2 side of the combined substrate T from below with the second holder 70. Then, the separating apparatus 5 moves, by the moving unit 60, the upper wafer W1 in a direction allowing the upper wafer W1 to be separated from a plate surface of the lower wafer W2.

Accordingly, the upper wafer W1 held by the first holder is continuously separated from the lower wafer W2, starting from one end thereof toward the other end. Hereinafter, the individual components of the separating apparatus 5 will be explained in detail.

The first holder 50 includes an elastic member 51 and a plurality of attracting units 52. The elastic member 51 is a thin plate-shaped member, and is formed of, by way of non-limiting example, a metal such as a metal plate. This elastic member 51 is disposed above the upper wafer W1 to face the upper wafer W1.

The plurality of attracting units 52 are provided on a surface of the elastic member 51 facing the upper wafer W1. Each attracting unit 52 is equipped with a main body 521 fixed to the elastic member 51; and a suction pad 522 provided under the main body 521.

Each attracting unit 52 is connected to an air intake device 524 such as a vacuum pump via a suction line 523. The first holder 50 attracts the non-bonding surface Win (see FIG. 2) of the upper wafer W1 with these attracting units 52 by a suction force generated by the air intake device 524. Accordingly, the upper wafer W1 is attracted to and held by the first holder 50.

Moreover, it is desirable that the suction pad 522 belonging to the attracting unit 52 is of a type having little deformation. If the suction pad 522 is largely deformed when the moving unit 60 to be described later pulls the first holder 50, a to-be-attracted portion of the upper wafer W1 would be greatly deformed due to this deformation, which raises a risk that the upper wafer W1 or the lower wafer W2 may be damaged.

Specifically, one having a rib on an attraction surface thereof, or a flat pad having a space height of 0.5 mm or less may be used as the suction pad 522, for example.

Figure 4:
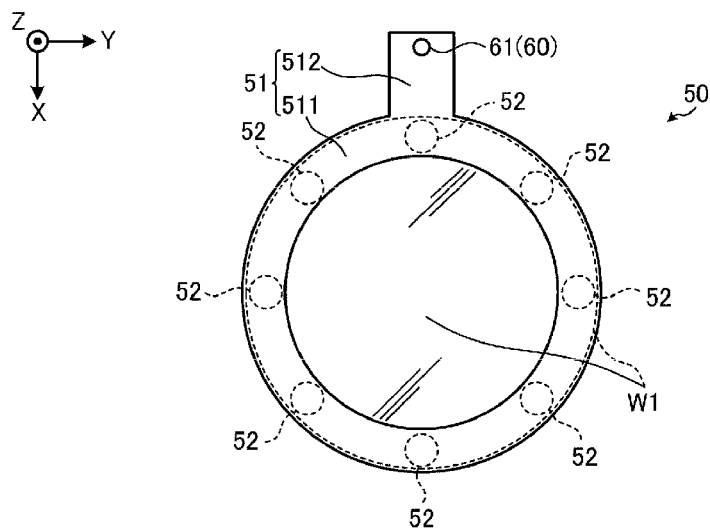
FIG. 4 is a schematic plan view of a first holder according to the exemplary embodiment.

Here, the configuration of the first holder 50 will be described in more detail with reference to FIG. 4. FIG. 4 is a schematic plan view of the first holder 50 according to the exemplary embodiment.

As shown in FIG. 4, the plurality of attracting units 52 belonging to the first holder 50 are arranged in an annular shape on the elastic member 51, facing an outer periphery of the upper wafer W1 to attract the outer periphery of the upper wafer W1. Here, although the following description will be provided for an example where eight attracting units 52 are provided on the elastic member 51, the number of the attracting units 52 provided on the elastic member 51 is not limited to eight.

Among these plurality of attracting units 52, the attracting unit 52 positioned nearest to a starting point of the separation (here, on the negative X-axis side) is disposed at a position close to a portion with which a blade 81 (see FIG. 3) of the separation inducing unit 80 (see FIG. 3) to be described later comes into contact. In other words, the blade 81 of the separation inducing unit 80 comes into contact with a side surface of the combined substrate T in the vicinity of the attracting unit 52 disposed on the negative X-axis side.

The elastic member 51 is equipped with a main body 511 and an extension portion 512. The main body 511 is an annular frame having a hollow center and having an outer diameter substantially equal to that of the upper wafer W1. On a bottom surface of the main body 511, that is, on a surface of the main body 511 facing the upper wafer W1, the plurality of attracting units 52 are arranged in the annular shape to conform to the shape of main body 511.

The extension portion 512 is a portion formed by extending a part of the outer periphery of the main body 511 which is located nearest to the starting point of the separation (here, the outer periphery on the negative X-axis side) toward a side (negative X-axis side) opposite to a direction in which the separation progresses. A support column member 61 of the moving unit 60 is connected to a leading end of this extension portion 512.

Referring back to FIG. 3, the other components of the separating apparatus 5 will be described. The moving unit 60 includes the supporting column member 61, a moving mechanism 62, and a load cell 63.

The supporting column member 61 is a member extending in a vertical direction (Z-axis direction) with one end thereof connected to the extension portion 512 (see FIG. 4) of the elastic member 51 and the other end connected to the moving mechanism 62 via an upper base 103.

The moving mechanism 62 is fixed on top of the upper base 103, and is configured to move the supporting column member 61 provided below in the vertical direction. The load cell 63 detects a load applied to the supporting column member 61.

This moving unit 60 lifts up the first holder 50 connected to the supporting column member 61 by moving the supporting column member 61 vertically upwards through the use of the moving mechanism 62. At this time, the moving unit 60 may pull the first holder 50 while controlling a force applied to the upper wafer W1 based on a detection result of the load cell 63.

Here, as shown in FIG. 4, the supporting column member 61 serving as a power point of the lifting is disposed opposite to the attracting unit 52 serving as a fulcrum of the lifting, that is, the attracting unit 52 disposed on the starting point of the separation (here, the negative X-axis side) in the direction in which the separation progresses.

Therefore, as shown in FIG. 3, a clockwise rotational force (moment) is generated at a side surface (a portion serving as the starting point of the separation) of the combined substrate T which serves as an acting point of the lifting. Accordingly, the moving unit 60 can pull up the upper wafer W1 such that the upper wafer W1 may be lifted up from its outer edge. Thus, the upper wafer W1 can be efficiently separated from the lower wafer W2.

Further, the first holder 50 is supported by the moving unit 60, and the moving unit 60 is supported by the upper base 103. In addition, the upper base 103 is supported by a fixed member 101 attached to a ceiling portion of the processing chamber 100 with a supporting column 102 therebetween.

The second holder 70 is disposed below the first holder 50, and attracts and holds the lower wafer W2 side of the combined substrate T. The second holder 70 includes a circular plate-shaped main body 71 and a supporting column member 72 supporting the main body 71.

The main body 71 is formed of, for example, a metal member such as aluminum. An attraction surface 73 is provided on a top surface of the main body 71. The attraction surface 73 is a porous body and is made of, for example, a resin member such as PCTFE (polychlorotrifluoroethylene).

A suction space 74 is formed inside the main body 71 to communicate with the outside through the attraction surface 73. The suction space 74 is connected to an air intake device 712 such as a vacuum pump via a suction line 711. This second holder 70 attracts the non-bonding surface W2$n$ (see FIG. 2) of the lower wafer W2 to the attraction surface 73 by using a negative pressure generated by the air intake of the air intake device 712, so that the combined substrate T is attracted to and held by the second holder 70.

The attraction surface 73 of the main body 71 is formed to have substantially the same diameter as the lower wafer W2. Accordingly, when a fluid L (see FIG. 6) to be described later is supplied to the side surface of the combined substrate T, the fluid L can be suppressed from being sucked from the attraction surface 73.

Further, if a non-attracting portion such as a groove is formed on the attraction surface for the lower wafer W2, there is a risk that the lower wafer W2 may crack at this non-attracting portion. To suppress this problem, the attraction surface 73 of the main body 71 is formed as a flat surface which does not have the non-attracting portion such as a groove. Therefore, it is possible to suppress formation of cracks in the lower wafer W2.

Further, since the attraction surface 73 is formed of the resin member such as PCTFE, a damage to the lower wafer W2 can be further suppressed.

Moreover, the main body 71 is provided with a groove-shaped drain 75 at an outer side than the attraction surface 73. The drain 75 is connected to a draining device 752 via a drain line 751. Thus, when the fluid L is supplied to the side surface of the combined substrate T, it is possible to suppress the fluid L from overflowing from the main body 71.

The second holder 70 is supported by a rotating/elevating mechanism 104 fixed to a bottom surface of the processing chamber 100. The rotating/elevating mechanism 104 is an example of a substrate rotating unit, and is configured to rotate the second holder 70 by rotating the supporting column member 72 about a vertical axis. Further, the rotating/elevating mechanism 104 moves the second holder 70 up and down by moving the supporting column member 72 in a vertical direction.

The separation inducing unit 80 is disposed outside the second holder 70. This separation inducing unit 80 forms, on the side surface of the combined substrate T, a portion serving as a starting point from which the upper wafer W1 is separated from the lower wafer W2.

The separation inducing unit 80 includes the blade 81, a moving mechanism 82, and an elevating mechanism 83. The blade 81 is, for example, a flat blade, and is supported by the moving mechanism 82 so that a tip of the blade projects toward the combined substrate T.

The moving mechanism 82 moves the blade 81 along a rail extending in the X-axis direction. The elevating mechanism 83 is fixed to, for example, the upper base 103, and serves to move the moving mechanism 82 in a vertical direction. Thus, a height position of the blade 81, that is, a contact position with respect to the side surface of the combined substrate T is adjusted.

After adjusting the height position of the blade 81 by using the elevating mechanism 83, the separation inducing unit 80 moves the blade 81 in a horizontal direction (here, in the positive X-axis direction) by using the moving mechanism 82. Further, the separation inducing unit 80 brings the blade 81 into contact with a bonding portion of the upper wafer W1 and the lower wafer W2 exposed on the side surface of the combined substrate T. As a result, the portion serving as the starting point from which the upper wafer W1 is separated from the lower wafer W2 is formed at the combined substrate T.

Additionally, the fluid supply 90 is disposed outside the second holder 70. The fluid supply 90 supplies the fluid L including water ($H_2O$) to the side surface of the combined substrate T. For example, the fluid supply 90 supplies the fluid L to the portion of the side surface of the combined substrate T with which the blade 81 of the separation inducing unit 80 comes into contact and the vicinity thereof.

The fluid supply 90 includes a nozzle 91 and a moving mechanism (not shown). The nozzle 91 discharges the fluid L. The moving mechanism is configured to move the nozzle 91 in a vertical direction and a horizontal direction.

<Details of Separating Processing>

Figure 5:
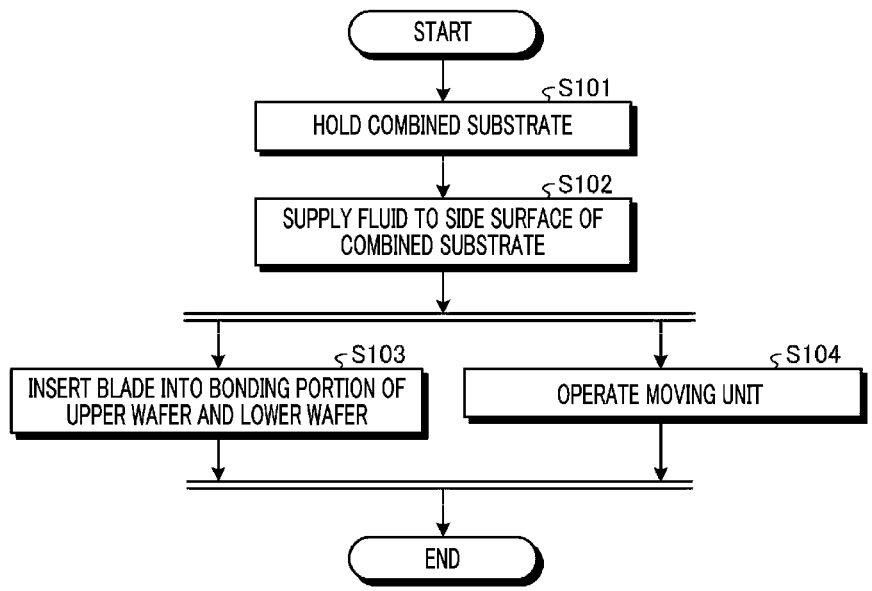
FIG. 5 is a flowchart illustrating a processing sequence of a separating processing performed by the separating apparatus according to the exemplary embodiment.

Now, details of the separating processing by the separating apparatus 5 will be explained with reference to FIG. 5 to FIG. 11. FIG. 5 is a flowchart illustrating a processing sequence of the separating processing performed by the separating apparatus 5 according to the exemplary embodiment. Further, the separating apparatus 5 performs individual processes of the processing sequence shown in FIG. 5 under the control of the controller 31 (see FIG. 1) of the control device 30 (see FIG. 1).

Figure 6:
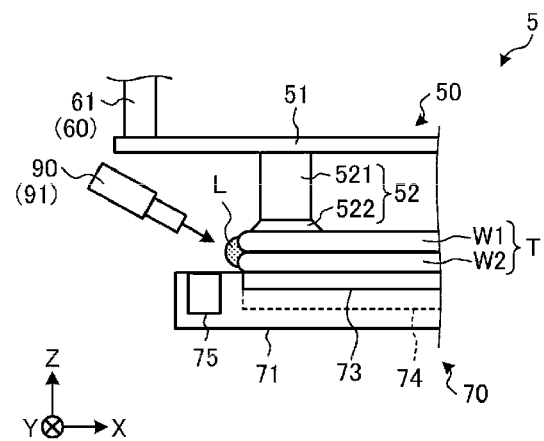
FIG. 6 is an enlarged side view illustrating one process of the separating processing according to the exemplary embodiment.

First, the controller 31 carries the combined substrate T into the processing chamber 100, and, as shown in FIG. 6, the lower wafer W2 side of the combined substrate T is held by the second holder 70, and the upper wafer W1 side of the combined substrate T is held by the first holder 50 (process S101).

Next, the controller 31 controls the fluid supply 90 to supply the fluid L to the side surface of the combined substrate T (process S102). Thus, the controller 31 causes the fluid L to come into contact with the side surface of the combined substrate T held by the first holder 50 and the second holder 70, as shown in FIG. 6.

Specifically, in the process S102, the controller 31 brings the fluid L into contact with the side surface of the combined substrate T located in the vicinity of the attracting unit 52 disposed on the negative X-axis side.

Figure 7:
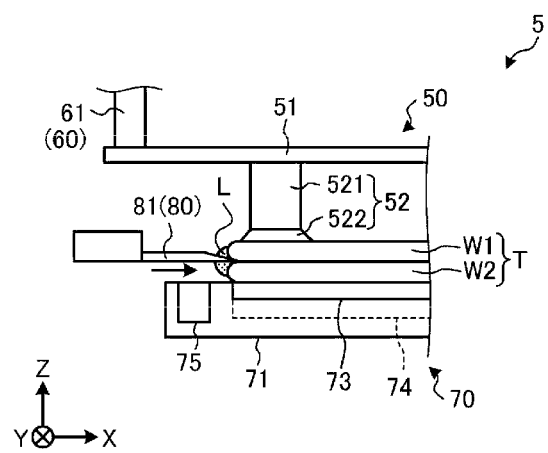
FIG. 7 is an enlarged side view illustrating one process of the separating processing according to the exemplary embodiment.

Next, as shown in FIG. 7, the controller 31 controls the separation inducing unit 80 to press the blade 81 against the side surface of the combined substrate T with which the fluid L is in contact, thus allowing the blade 81 to be inserted into the bonding portion of the upper wafer W1 and the lower wafer W2 in the combined substrate T (process S103).

That is, in the process S103, the controller 31 firmly presses the blade 81 against the side surface of the combined substrate T located in the vicinity of the attracting unit 52 disposed on the negative X-axis side.

Here, the effect of the fluid L when separating the upper wafer W1 from the combined substrate T by using the blade 81 will be described with reference to FIG. 8A to FIG. 9. FIG. 8A to FIG. 8C are diagrams for describing a change in the state of the bonding portion in the separating processing according to the exemplary embodiment.

As shown in FIG. 8A, in the combined substrate T according to the exemplary embodiment, the upper wafer W1 and the lower wafer W2 are combined by a siloxane bond (Si—O—Si). Meanwhile, when the blade 81 is inserted, a stress is applied to this bonding portion, so that a water molecule ($H_2O$) contained in the fluid L and the siloxane bond react with each other, as illustrated in FIG. 8B.

As the siloxane bond and the water molecule react at the bonding portion of the upper wafer W1 and the lower wafer W2, the siloxane bond is cut, as shown in FIG. 8C. Resultantly, the bonding strength at this bonding portion is reduced.

FIG. 9 is a diagram showing a difference in bonding strength between a case in which moisture is supplied to the combined substrate T and a case in which moisture is not supplied to the combined substrate T in the separating processing. Further, FIG. 9 also shows a film kind (SiCN, a TEOS oxide film, $ThO_x$ (thermal oxide film)) of the bonding surfaces W1$j$ and W2$j$ and a type of plasma ($O_2$, $N_2$) used at the time of pre-treating the bonding surfaces W1$j$ and W2$j$.

As can be seen from the result shown in FIG. 9, the bonding strength in the separating processing is reduced by supplying the fluid L containing water to the combined substrate T which has the bonding portion in various states.

Reference is made back to FIG. 5. The controller 31 operates the moving unit 60 (see FIG. 3) in parallel with the processing of the above-described process S103 (process S104). Specifically, the controller 31 moves a part of the outer periphery of the first holder 50, specifically, the extension portion 512 (see FIG. 4) of the elastic member 51 in a direction allowing the extension portion 512 from being separated from the second holder 70, as shown in FIG. 10.

Accordingly, the attracting unit 52 disposed in the vicinity of the portion where the blade 81 is inserted is pulled upwards, so that the upper wafer W1 begins to be separated from the combined substrate T starting from the portion where the blade 81 is inserted.

Figure 10:
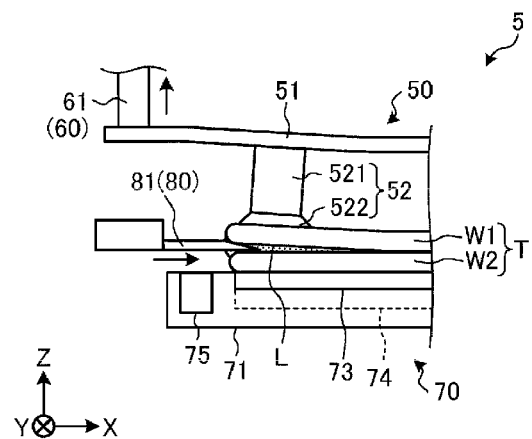
FIG. 10 is an enlarged side view illustrating one process of the separating processing according to the exemplary embodiment.

Further, as depicted in FIG. 10, after the upper wafer W1 starts to be separated from the combined substrate T, the fluid L gradually permeates to an inside of the bonding portion of the upper wafer W1 and the lower wafer W2 due to a capillary action. Accordingly, since a chemical reaction shown in FIG. 8A to FIG. 8C also takes place inside the bonding portion, the bonding strength can be reduced at the inside of the bonding portion as well.

Figure 11:
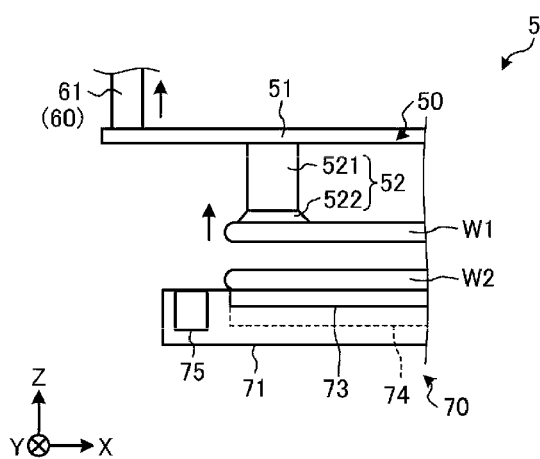
FIG. 11 is an enlarged side view illustrating one process of the separating processing according to the exemplary embodiment.

Thereafter, the controller 31 inserts the blade 81 into the bonding portion of the upper wafer W1 and the lower wafer W2, and operates the moving unit 60 to further lift up the first holder 50. As a result, the separation continuously proceeds from an end of the upper wafer W1 on the negative X-axis side toward the opposite end thereof on the positive X-axis side, and finally, the upper wafer W1 is separated from the combined substrate T (see FIG. 10), as illustrated in FIG. 11. Through these operations, the series of processes of the separating processing are ended.

As described so far, in the exemplary embodiment, when the upper wafer W1 is separated from the combined substrate T by using the moving unit 60 and the blade 81, the fluid L including the water is brought into contact with the side surface of the combined substrate T. Accordingly, since the separating processing can be carried out while reducing the bonding strength between the upper wafer W1 and the lower wafer W2, the efficiency of the separating processing can be improved.

Furthermore, in the exemplary embodiment, after the fluid L is supplied from the nozzle 91 to the side surface of the combined substrate T, it may be desirable to press the blade 81 against the side surface to which the fluid L has been supplied. By doing so, even if the combined substrate T has high bonding strength as it is bonded by an intermolecular force, the separating processing can be performed accurately and efficiently.

In addition, in the exemplary embodiment, the fluid L containing water may be a liquid, desirably. Accordingly, the fluid L can gradually permeate to the inside of the bonding portion of the upper wafer W1 and the lower wafer W2 by the capillary action. Therefore, according to the exemplary embodiment, the separating processing can be made more efficient.

Moreover, in the exemplary embodiment, it may be desirable that the fluid L containing water may be heated by a heating unit (not shown) of the fluid supply 90. Accordingly, since the chemical reaction shown in FIG. 8A to FIG. 8C can be accelerated at the bonding portion of the upper wafer W1 and the lower wafer W2, the bonding strength between the upper wafer W1 and the lower wafer W2 can be further reduced.

Therefore, according to the exemplary embodiment, the separating processing can be made more efficient.

Additionally, the fluid L according to the exemplary embodiment may be acidic, neutral or alkaline. For example, in case that the upper wafer W1 and the lower wafer W2 are combined by a so-called Cu—Cu direct bond, it may be possible to control the fluid L to be weakly alkaline (pH=about 7 to 8), thus suppressing Cu located at the bonding portion from being transformed into the liquid L.

Various Modification Examples

Now, various modification examples of the exemplary embodiment will be described with reference to FIG. 12 to FIG. 14. Further, in the following various modification examples, parts identical to those of the exemplary embodiment will be assigned same reference numerals, and redundant description thereof will be omitted.

Figure 12:
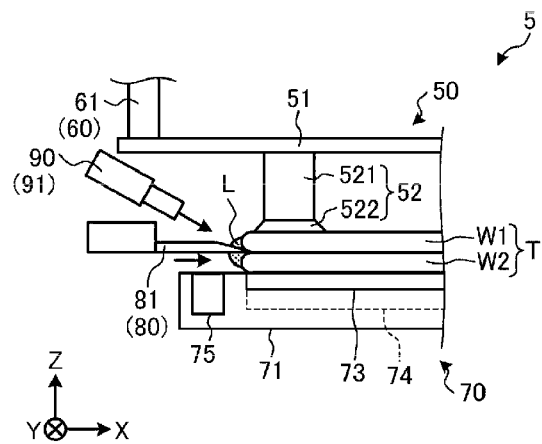
FIG. 12 is an enlarged side view illustrating one process of a separating processing according to a first modification example of the exemplary embodiment.

FIG. 12 is an enlarged side view showing one process of a separating processing according to a first modification example of the exemplary embodiment. As shown in FIG. 12, in the first modification example, when the blade 81 is firmly pressed against the side surface of the combined substrate T, the fluid L is supplied from the nozzle 91 to this side surface. That is, in the first modification example, the processing of pressing the blade 81 against the side surface of the combined substrate T and the processing of supplying the fluid L from the nozzle 91 are performed simultaneously.

In this way as well, it is possible to carry out the separating processing while reducing the bonding strength between the upper wafer W1 and the lower wafer W2. Therefore, according to the first modification example, the efficiency of the separating processing can be improved.

Further, in the first modification example, since the fluid L of a dynamic pressure is supplied to the starting point of the separation, it is possible to allow the fluid L to permeate to the inside of the bonding portion of the upper wafer W1 and the lower wafer W2 effectively. Therefore, according to the first modification example, since the bonding strength between the upper wafer W1 and the lower wafer W2 can be further reduced, the separating processing can be made more efficient.

Moreover, in the first modification example, it may be desirable that the fluid L containing water may be heated by the heating unit of the fluid supply 90, the same as in the exemplary embodiment. As a result, the chemical reaction shown in FIG. 8A to FIG. 8C can be accelerated at the bonding portion of the upper wafer W1 and the lower wafer W2, so that the bonding strength between the upper wafer W1 and the lower wafer W2 can be further reduced.

Additionally, in the first modification example, the fluid L may be a liquid or water vapor. When the fluid L is water vapor, the chemical reaction shown in FIG. 8A to FIG. 8C can be further accelerated at the bonding portion of the upper wafer W1 and the lower wafer W2. Therefore, according to the first modification example, the efficiency of the separating processing can be further improved.

Figure 13:
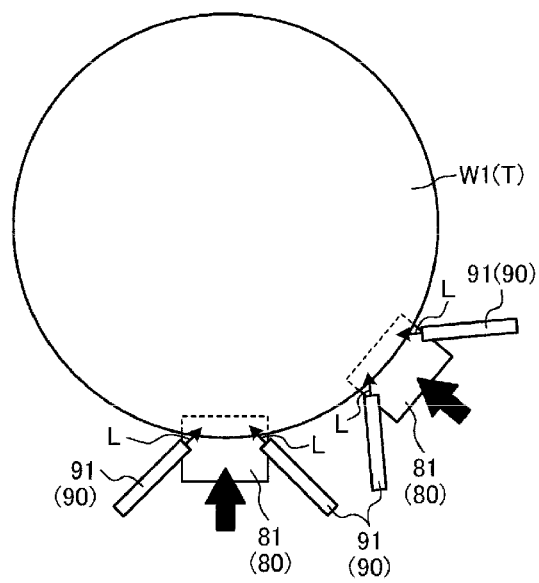
FIG. 13 is a schematic plan view illustrating one process of the separating processing according to the first modification example of the exemplary embodiment.

FIG. 13 is a schematic plan view showing one process of the separating processing according to the first modification example of the exemplary embodiment. As illustrated in FIG. 13, in the first modification example, the separating processing may be performed while pressing a plurality of (two in the drawing) blades 81 against the combined substrate T. In this way, the efficiency of the separating processing can be further bettered.

In addition, in the first modification example, the fluid L may be supplied to every single blade 81 by using a plurality of (two in the drawing) nozzles 91, as shown in FIG. 13. In this way, since the fluid L can be sufficiently supplied to a target portion to be separated, the efficiency of the separating processing can be further improved.

Furthermore, although the two blades 81 are used in the example of FIG. 13, the number of the blades 81 may be three or more. Further, in the example of FIG. 13, although the two nozzles 91 are disposed for every single blade 81, three or more nozzles 91 may be provided for the single blade 81.

Figure 14:
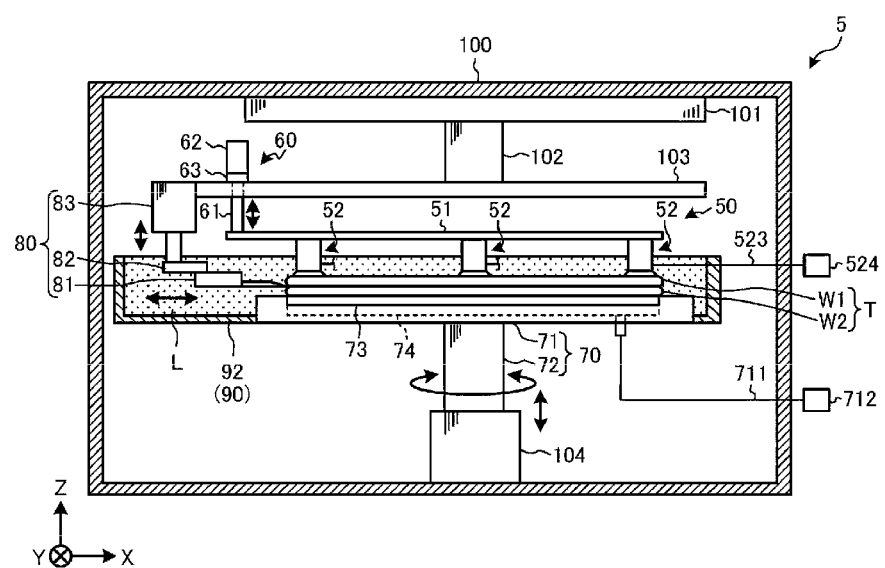
FIG. 14 is a schematic side view illustrating a configuration of a separating apparatus according to a second modification example of the exemplary embodiment.

FIG. 14 is a schematic side view showing a configuration of the separating apparatus 5 according to a second modification example. As shown in FIG. 14, the second modification example is different from the exemplary embodiment in that a storage tank 92 is provided in the fluid supply 90.

The storage tank 92 is configured to be capable of storing the fluid L therein, and is also configured to be capable of holding the combined substrate T therein. In this second modification example, the controller 31 (see FIG. 1) performs the separating processing while immersing the combined substrate T in the liquid fluid L stored in the storage tank 92.

In this way as well, it is possible to carry out the separating processing while reducing the bonding strength between the upper wafer W1 and the lower wafer W2. Therefore, according to the second modification example, the efficiency of the separating processing can be improved.

Furthermore, in the second modification example, it may be desirable that the fluid L containing water may be heated by the heating unit of the fluid supply 90. Accordingly, since the chemical reaction shown in FIG. 8A to FIG. 8C can be accelerated at the bonding portion of the upper wafer W1 and the lower wafer W2, the bonding strength between the upper wafer W1 and the lower wafer W2 can be further reduced.

The separating apparatus 5 according to the exemplary embodiment includes the first holder 50, the second holder 70, the fluid supply 90, and the controller 31. The first holder 50 is configured to hold, in the combined substrate T in which the first substrate (upper wafer W1) and the second substrate (lower wafer W2) are bonded to each other, the first substrate (upper wafer W1), and configured to move the first substrate (upper wafer W1) in a direction allowing the first substrate to be separated from the second substrate (lower wafer W2). The second holder 70 is configured to hold the second substrate (lower wafer W2) in the combined substrate T. The fluid supply 90 is configured to supply the fluid L containing water to the side surface of the combined substrate T. The controller 31 is configured to control the first holder 50, the second holder 70 and the fluid supply 90. Further, the controller 31 holds the combined substrate T by the first holder 50 and the second holder 70. In addition, the controller 31 separates the first substrate (upper wafer W1) from the combined substrate T starting from the side surface thereof, while bringing the fluid L containing water into contact with the side surface by the fluid supply 90. Therefore, the efficiency of the separating processing can be improved.

Moreover, in the separating apparatus 5 according to the exemplary embodiment, the fluid supply 90 has the multiple nozzles 91 configured to discharge the fluid L containing water. Thus, the separating processing can be made more efficient.

Moreover, in the separating apparatus 5 according to the exemplary embodiment, the fluid supply 90 has the storage tank 92 configured to store therein the fluid L containing liquid water. Therefore, the efficiency of the separating processing can be improved.

Moreover, in the separating apparatus 5 according to the exemplary embodiment, the fluid supply 90 has the heating unit configured to heat the fluid L containing water. Thus, the efficiency of the separating processing can be further improved.

Moreover, the separating apparatus 5 according to the exemplary embodiment is further equipped with the substrate rotating unit (the rotating/elevating mechanism 104) configured to rotate the second holder 70. Therefore, the efficiency of the separating processing can be further improved.

In addition, the separating system 1 according to the exemplary embodiment includes the separating apparatus 5, and the cleaning apparatus (the first cleaning station 15 and the second cleaning station 22). The separating apparatus 5 is configured to separate the first substrate (upper wafer W1) from the combined substrate T in which the first substrate (upper wafer W1) and the second substrate (lower wafer W2) are bonded to each other. The cleaning apparatus (the first cleaning station 15 and the second cleaning station 22) is configured to clean the second substrate (lower wafer W2) and the first substrate (upper wafer W1) after being separated. The separating apparatus 5 has the above-described configuration. Thus, the efficiency of the separating processing can be further improved.

Moreover, a separating method according to the exemplary embodiment includes holding the combined substrate T (the process S101) and separating the first substrate. In the holding of the combined substrate T (the process S101), the combined substrate T in which the first substrate (upper wafer W1) and the second substrate (lower wafer W2) are bonded is held. In the separating of the first substrate, the first substrate (upper wafer W1) is separated from the combined substrate T, staring from the side surface of the combined substrate T. Further, the separating of the first substrate includes brining the fluid L containing water into contact with the side surface (the process S102). Thus, the separating processing can be made efficient.

Moreover, in the separating method according to the exemplary embodiment, the fluid L containing water is water vapor. Thus, the efficiency of the separating processing can be further improved.

In addition, in the separating method according to the exemplary embodiment, the fluid L containing water is a liquid. Thus, the efficiency of the separating processing can be further improved.

Furthermore, in the separating method according to the exemplary embodiment, the separating of the first substrate is performed while discharging the fluid L containing water from the multiple nozzles 91. Thus, the efficiency of the separating processing can be further enhanced.

In the separating method according to the exemplary embodiment, the separating of the first substrate includes supplying the fluid L containing water (the process S102) and pressing the blade 81 (the S103). In the supplying of the fluid L containing water (the process S102), the fluid L containing water is supplied from the nozzle 91 to the side surface. In the pressing of the blade 81 (the process S103), the blade 81 is pressed firmly against the side surface to which the fluid L containing water is supplied. Therefore, even if the combined substrate T has high bonding strength as it is combined by an intermolecular force, the separating processing can be performed accurately and efficiently.

In the separating method according to the exemplary embodiment, the separating of the first substrate is performed by immersing the combined substrate T in the fluid L containing water, the fluid being stored. Thus, the efficiency of the separating processing can be improved.

Moreover, in the separating method according to the exemplary embodiment, the fluid L containing water is heated. Therefore, the separating processing can be made more efficient.

Further, in the separating method according to the exemplary embodiment, in the combined substrate T, the first substrate (upper wafer W1) and the second substrate (lower wafer W2) are bonded by an intermolecular force. Thus, the combined substrate T in which the upper wafer W1 and the lower wafer W2 are firmly bonded can be achieved.

So far, the exemplary embodiment of the present disclosure has been described. However, the present disclosure is not limited to the above-described exemplary embodiment. Various changes may be made without departing from the sprit or scope of the subject matter presented herein. By way of example, although the above exemplary embodiment has been described for the example where the upper wafer W1 is separated from the combined substrate T in which the upper wafer W1 and the lower wafer W2 are bonded by an intermolecular force, the present disclosure is not limited thereto.

For example, in the present disclosure, the lower wafer W2 may be separated from the combined substrate T. Further, in the present disclosure, the upper wafer W1 or the lower wafer W2 may be separated from the combined substrate T in which the upper wafer W1 and the lower wafer W2 are bonded with an adhesive.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to improve the efficiency of a separating processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A separating method, comprising:
   holding a combined substrate in which a first substrate and a second substrate are bonded; and
   separating the first substrate from the combined substrate, starting from a side surface of the combined substrate,
   wherein the separating of the first substrate comprises:
   bringing a fluid containing water into contact with the side surface;
   supplying the fluid containing water to the side surface from a nozzle; and
   pressing a blade firmly against the side surface to which the fluid containing water is supplied by moving the blade in a horizontal direction,
   wherein the fluid containing water is a liquid, and
   the separating of the first substrate is performed by immersing the combined substrate in the fluid containing water, the fluid being stored.

2. The separating method of claim 1,
   wherein the fluid containing water is heated.

3. The separating method of claim 1,
   wherein in the combined substrate, the first substrate and the second substrate are bonded by an intermolecular force.

\* \* \* \* \*

UNITED STATES PATENT AND TRADEMARK OFFICE
CERTIFICATE OF CORRECTION

PATENT NO. : 12,157,293 B2
APPLICATION NO. : 17/820299
DATED : December 3, 2024
INVENTOR(S) : Takashi Terada et al.

Page 1 of 1

It is certified that error appears in the above-identified patent and that said Letters Patent is hereby corrected as shown below:

In the Specification

Column 6, Line 23, "Win" should be -- W1n --.

Signed and Sealed this
Fourth Day of March, 2025

Coke Morgan Stewart
*Acting Director of the United States Patent and Trademark Office*